United States Patent [19]

Gulczynski

[11] Patent Number: 4,763,106
[45] Date of Patent: Aug. 9, 1988

[54] FLASH ANALOG-TO-DIGITAL CONVERTER
[76] Inventor: Zdzislaw Gulczynski, P.O. Box 441, Winchester, Mass. 01890
[21] Appl. No.: 75,447
[22] Filed: Jul. 20, 1987
[51] Int. Cl.$^4$ ............................................. H03M 1/36
[52] U.S. Cl. ............................................ 340/347 AD
[58] Field of Search ................................ 340/347 AD
[56] References Cited
U.S. PATENT DOCUMENTS
3,932,865 1/1976 Sagara ....................... 340/347 AD
FOREIGN PATENT DOCUMENTS
2261661 10/1975 France .......................... 340/347 AD Primary Examiner—Charles D. Miller

[57] ABSTRACT

This flash analog-to-digital converter (ADC) offers the fastest possible high resolution conversion as the quantization level of the input signal is determined in a straightforward structure, whereby no feedback exists. For instance, a 16-bit flash ADC employs approximately 555 rather than 65,535 comparators normally required. In another embodiment only approximately 150 comparators are required. One or two noninverting amplifiers are used.

In the preferred embodiment, the ADC input signal is applied to a resistor network coupled between the ADC input and a reference current source. A plurality of comparators is coupled to the resistor network for comparing comparison signals deriving therefrom against ground, and producing a first code. In response thereto, a multiplexer selects one of the comparison signals which is amplified and then converted in an ADC unit into a second code. The successively produced first and second codes are converted in an encoder into corresponding binary codes which are added in an adder for providing the output code of the ADC.

19 Claims, 3 Drawing Sheets

FLASH ANALOG-TO-DIGITAL CONVERTER

CROSS REFERENCE TO RELATED APPLICATIONS

This application is related to the application Ser. No. 075,448, filed 7/20/87, entitled "Dual Flash Analog-to-Digital Converter" and two applications Ser. Nos. 075,449 and 075,450, both entitled "Digital-to-Analog Converter", both filed on even date herewith, the contents of which are hereby incorporated by reference herein, and is also related to the applications entitled "Flash Analog-to-Digital Converter" Ser. No. 946,693 and "Encoder for Flash Analog-to-Digital Converters" Ser. No. 946,598 both filed on 12/24/86, and "Analog-to-Digital Converter" Ser. No. 020,783 filed on 3/2/87. All inventions are by the same inventor.

BACKGROUND OF THE INVENTION

The invention relates to a flash analog-to-digital converter (ADC) for digital systems requiring an extremely fast high resolution conversion of an analog input signal into a corresponding digital output code.

Two parts can be distinguished in every flash ADC: an analog and a digital sections. The analog section of the conventional N-bit flash ADCs consists of a reference source, K comparators connected in parallel and a chain of K (mostly K +1) equally valued resistors providing reference voltages thereto, whereby $K=2^N-1$. The digital section consists of an encoder for sampling comparator output signals, correcting faulty code sequences and obtaining the binary output code, and a register for storing the code. All ADCs are clocked.

The flash ADCs offer the fastest possible conversion as the quantization level of the input voltage is determined in a straightforward structure, particularly no feedback manipulating the input signal is used. They do suffer however from many problems, mostly originating from a very high circuit complexity. For instance, a 10-bit flash ADC demands 1023 comparators and comparable number of switching elements to a modern 16-bit microprocessor. A 16-bit ADC according to ordinary constructions is virtually impossible, requiring 65,535 comparators not to mention other necessary components.

An input track-and-hold amplifier (THA) is mandatory for optimizing speed and accuracy. Furthermore, an amplifier must be able to drive a large and varying input capacitance of the ADC. Practically limited error correction schemes result in missing codes.

Other background of the present invention is conventional dual flash ADC in which first "flash encoded" most significant bits (MSBs) are converted in a digital-to-analog converter into an analog signal. This signal is subtracted from the input signal of the ADC, the result is amplified and available for a second conversion in a similar circuit to yield least significant bits (LSBs). The MSBs and LSBs are added for obtaining the output code of the ADC. A THA and a digital correction are necessary. The dual flash ADCs offer fastest possible conversion, whereby the resolution is almost twice as high as of the flash ADC chip used in the device. However, the high circuit complexity, variety of technologies, necessity of trimming numerous individual components, etc. makes a monolithic integration of these ADCs impossible. Not the least of the significant drawbacks is extremely high cost.

SUMMARY OF THE INVENTION

The invention is intended to provide a flash ADC having an extremely high speed and resolution. The number of components is drastically reduced so that a monolithic and even hybrid integration of the present embodiments can be accomplished.

According to the present invention an ADC converts signal of input source into output code and comprises: a reference current source, a resistive means coupled between the input source and reference current source for providing a plurality of comparison signals, amplifier means each coupled for amplifying a respective comparison signal and providing an output signal, comparator means coupled for comparing the amplifier means output signals against ground, and producing a first code in response thereto, a multiplexer means for selecting one of the amplifier means output signals in response to the first code, an ADC means for converting the signal selected by the multiplexer means into a second code, and a digital means for converting the first and second codes into the output code of the ADC.

In another embodiment the ADC comprises: a reference current source, a resistive means coupled between the input source and reference current source for providing a plurality of comparison signals, comparator means coupled for comparing the comparison signals against ground, and producing a first code in response thereto, a multiplexer means for selecting one of the comparison signals in response to the first code, an amplifier means for amplifying the comparison signal selected by the multiplexer means and providing an output signal, an ADC means for converting the amplifier means output signal into a second code, and a digital means for converting the first and second codes into the output code of the ADC.

BRIEF DESCRIPTION OF THE DRAWINGS

The present invention will become more clear in conjunction with the accompanying figures of which.

DETAILED DESCRIPTION OF THE INVENTION

Figure 1:
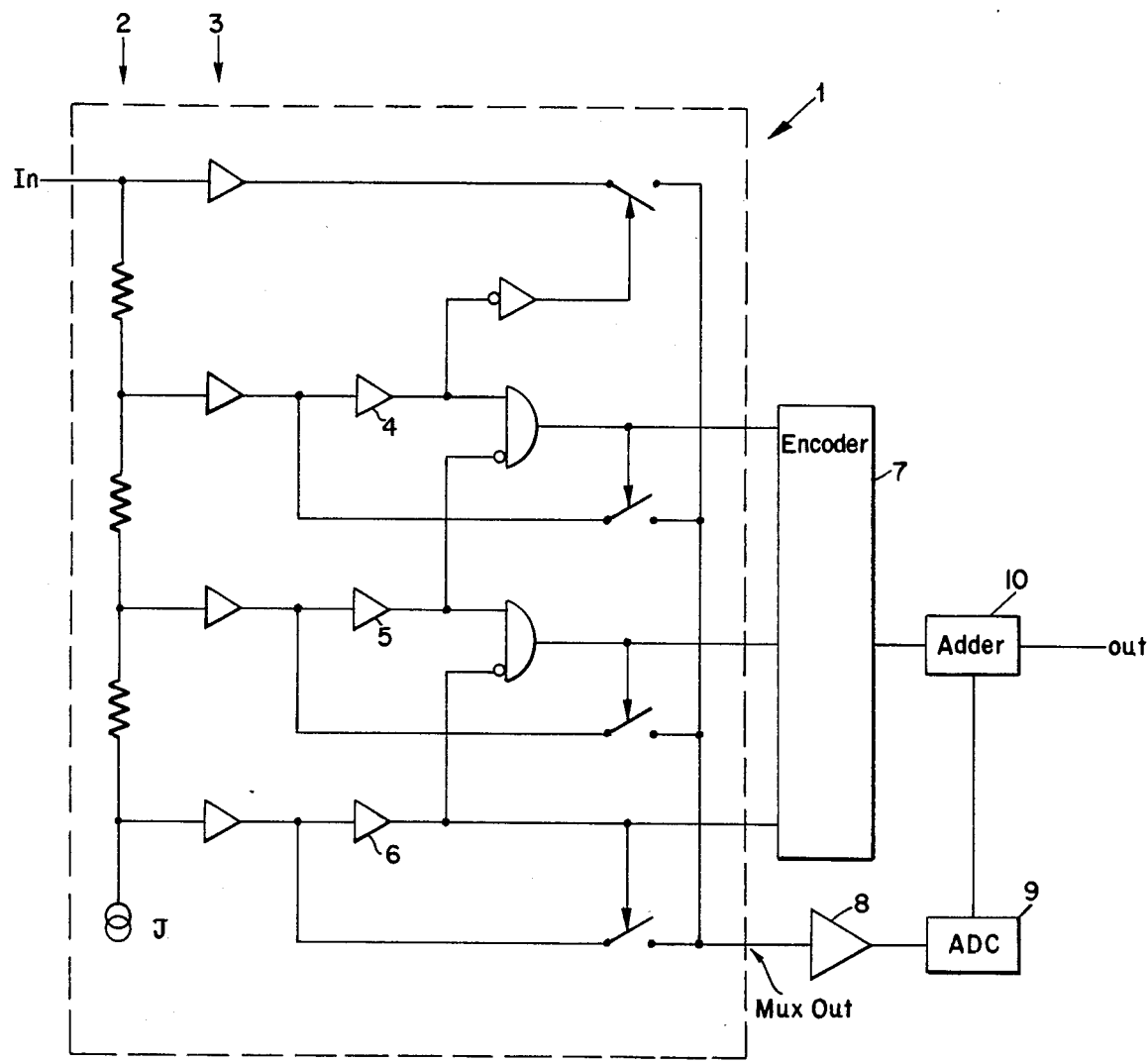
FIG. 1 is a schematic diagram of a 4-bit flash ADC of the present invention.

FIG. 1 is a schematic diagram of a 4-bit flash ADC of the present invention. The momentary value of the ADC input signal can be stored by any THA coupled in series with the ADC input. However, no THA is necessary if the ADC input signal will change by less than approximately one quantization step and within the conversion time of the ADC. The comparator/multiplexer section 1 provides the ADC input and operates to obtain a first code and a multiplexer output signal.

The comparator/multiplexer section 1 includes a number of components. The resistor network 2 consists of a chain of equally valued resistors coupled between the ADC input and the reference current source J for providing a plurality of comparison signals. The signals are separately amplified by the amplifiers 3 having substantially equal gains. The comparators 4 thru 6 are separately coupled thereto for comparing the amplified comparison signals against ground, thereby determining polarity thereof, and obtaining the first code. The amplified comparison signals are also separately applied to switches for selecting one of the signals in response to the first code. The switches constitute a multiplexer as each switch is coupled for applying the output signal of the respective amplifier to the multiplexer output of the section 1.

Only one pair of adjacent comparators, i.e. having inputs coupled to the same resistor of the network 2 via the respective amplifier, outputs "one-zero". All comparators coupled to the amplifiers receiving comparison signals having higher and lower values output "one" and "zero" respectively. The code produced by the comparators, referred to as the "thermometer" code, is converted in the first code. This code has only a single "one" indicating the "one-zero" break and is thus well suited for controlling the switches of the multiplexer.

For that purpose a plurality of AND gates is used, each having a noninverting and inverting inputs and coupled to the outputs of adjacent comparators which are 4, 5 and 5, 6. This also significantly simplifies the multiplexer structure as in place of its decoder the AND gates, each controlling a single switch, are used. Moreover, the output code of the section 1 is the first code deriving from the gates, as shown in FIG. 1. Generally, the "thermometer" code would result in a more complex structure of an encoder processing the code.

In the following the term 1LSB refers to the resolution of the section 1 and thus corresponds to a 2-bit resolution. The current of the reference current source J is chosen in such a manner that for the ADC input voltage equal to the full scale range (FSR), the smallest comparison voltage is 1lLSB, whereby the voltage drop across each resistor of the network 2 is 1lLSB. Similarly, the gain of each amplifier 3, G, is chosen in such a manner that its output signal is equal to the FSR if its input signal is 1lLSB. For the 4-bit ADC, G=4.

The multiplexer output signal is zero or positive and smaller than the FSR, with reference to ground. This is determined by the comparators 4 thru 6. The multiplexer includes four switches for selecting one of the four amplified comparison signals in response to the first code. For instance, for the ADC input signal below 1lLSB, the switch controlled by the comparator 4 is on. For the voltages equal or higher than 1lLSB one of the remaining switches is on. For example, if the ADC input signal is equal or higher than FSR−1LSB, the switch controlled by the comparator 6 is on. Abnormal operating conditions of the ADC can be detected by a pair of additional comparators sensing ADC input signals below zero and equal or higher than the FSR.

The optional amplifier 8 is coupled between the multiplexer output and the ADC means. For instance, a voltage follower can be employed if the on-resistance of the individual switches employed in the multiplexer is significant or the input conductance and/or capacitance of the ADC means 9 are essential. The combined gains of any amplifier 3 and the amplifier 8 should be 4. For instance, all amplifiers can have gain equal 2.

The ADC means 9 is coupled to the multiplexer via the optional amplifier 8 for converting the output signal thereof into a second binary code. An ADC of any type can be used. However, a flash ADC will result in the highest possible conversion rate.

A digital section of the ADC comprises the encoder 7 coupled to the comparator/multiplexer section 1 for converting the first code into a first binary code, and the adder 10 for adding the first and second binary codes and providing the output code of the ADC. The first binary code has a higher weight proportional to G multiplied by the gain of the amplifier 8. The higher weight can be attained simply by applying the first binary code to input terminals of the adder 10 having higher weight. In an ADC with a low number of comparators in the section 1, a read only memory (ROM) can be used in place of the encoder 7 and adder 10. Ideally, the first and second binary codes are respectively MSBs and LSBs of the ADC output code, whereby no adder is necessary.

The operation of the ADC will become even more clear by further analyzing the operation of the comparator/multiplexer section 1 of the 4-bit ADC. As mentioned, G=4 if the amplifier 8 is a voltage follower or is replaced by short circuit. For clarity and by way of example, three ADC input voltages are specified. The outputs of the comparator 6 and gate coupled to the comparator 4 can be applied in reverse order to the encoder 7 for obtaining ascent first codes. For the FSR equal 4 V, 1lLSB corresponds to 1 V.

| ADC input voltage | Mux output voltage | Thermometer code | First code |
| --- | --- | --- | --- |
| 1.89 V | G * 0.89 V | 100 | 100 |
| 2.00 V | 0.00 V | 110 | 010 |
| 2.34 V | G * 0.34 V | 110 | 010 |

In another embodiment the amplifiers 3 are eliminated, i.e. replaced by short circuits, whereby G=1. Consequently, the amplifier 8 has the gain equal 4. The ADC is less complex and possibly faster. However, more accurate comparators 4 thru 6 are required. For instance, each comparator must have a higher open loop gain, lower input capacitance, bias current, offset voltage, drifts, etc. Some capabilities can be adapted. For example, constant bias currents can be considered by adequate values of the individual resistors of the network 2. Moreover, the comparator inaccuracies which are most difficult to compromise, such as open loop gain and offset voltage, are eliminated on principle. In any case, the multiplexer output signal must not result in exceeding linear operating ranges of the amplifier 8 and ADC means 9.

Figure 2:
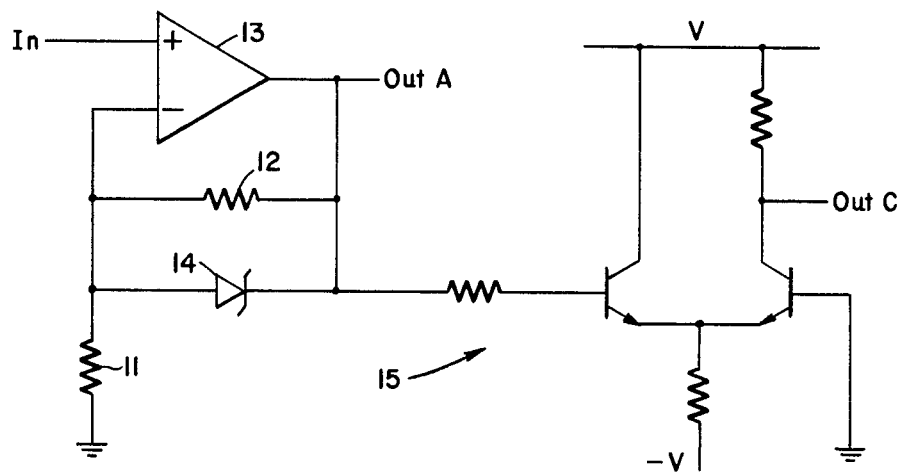
FIG. 2 is an embodiment of an amplifier/comparator pair.

FIG. 2 is an embodiment of an amplifier/comparator pair. The section 1 of FIG. 1 comprises three such pairs as each of the comparators 4, 5 and 6 is coupled to one of the amplifiers 3. The noninverting input of the operational amplifier (OA) 13 is coupled to receive the respective comparison voltage deriving from the resistor network 2 in FIG. 1. The inverting input of the OA 13 is coupled to the output thereof via the resistor 12 and to ground via the resistor 11. Thus, an ordinary noninverting amplifier configuration is constituted, whereby the resistors 11 and 12 determine the gain G of the amplifier.

Only one amplifier must operate within its linear range. The amplifiers receiving higher and lower comparison signals provide respectively higher and lower output voltages which may be out of the linear range. However, merely their polarities are detected by the comparators so that the output voltage of the amplifier operating in the linear range appears at the multiplexer output in response to the first code.

In order to prevent saturation of the OA 13, which would impair its speed and accuracy, the zener diode 14 is employed. Its cathode and anode are coupled to the output and inverting input of the OA 13 respectively. The zener voltage of the diode 14 is higher than G times 1LSB so that its leakage current does not cause considerable nonlinearities of the amplifier. However, the actual output voltage of the OA 13 may be negative or beyond the FSR. The output of the OA 13, Out A, is coupled to a respective switch of the multiplexer and to the comparator 15.

The comparator 15 is exemplified by an ordinary differential amplifier having a pair of n-p-n transistors with emitters coupled to the voltage source $-V$ via a resistor. The output of the OA 13 is coupled to the base of one transistor via a resistor. The base of the other transistor is coupled to ground, whereby its collector is coupled via a resistor to a voltage source V and the output of the comparator 15, Out C. It shall be pointed out that the structure of the comparator 15 is very simple due to the amplification of the preceding amplifier.

Figure 3:
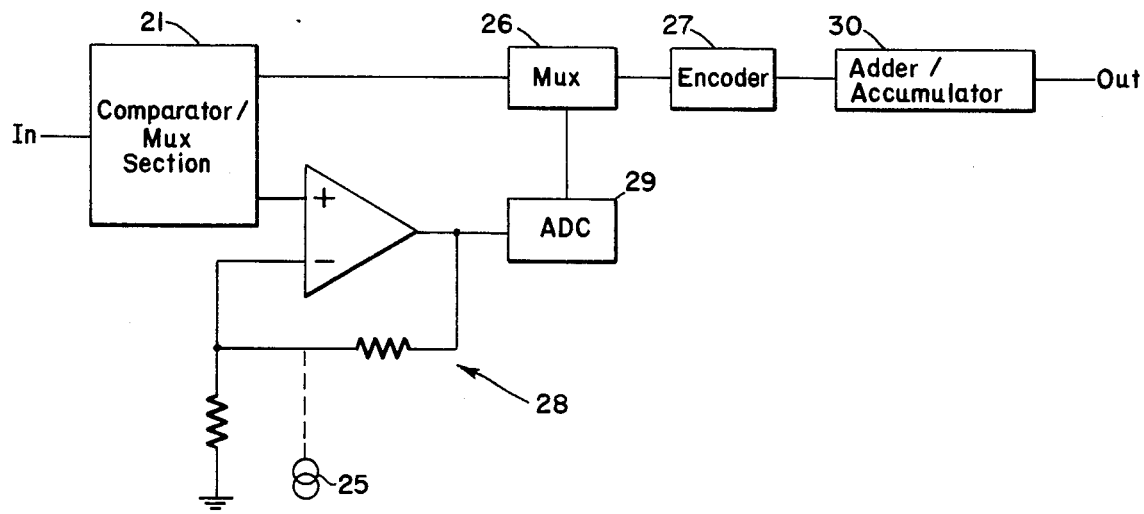
FIG. 3 is the preferred embodiment with a single encoder.

FIG. 3 is the preferred embodiment with the single encoder 27. The ADC input signal is applied to the comparator/multiplexer section 21, whereby the section 1 embodied in FIG. 1 can be employed. Similarly, the amplifier 28 is optional. In the preferred embodiment however, amplifiers of the section 21, analogous to amplifiers 3 of FIG. 1, are eliminated and the amplifier 28 remains.

The multiplexer output signal of the section 21 is applied to the noninverting amplifier 28. The amplifier includes an OA and a pair of resistors, coupled like 11 thru 13 in FIG. 2. Further included is the optional current source 25 coupled to the inverting input of the OA for causing a predetermined output offset voltage of the amplifier 28. By these means any conventional ADC can be employed as the ADC means 29 since an unipolar voltage can be applied thereto. A digital code corresponding to the offset voltage can be added/subtracted in the adder/accumulator 30.

The digital section includes the multiplexer 26 operative to successively output the first and second codes applied thereto. The multiplexer 26 initially selects the first code deriving from the section 21. While the code is converted by the encoder 27 into the first binary code, the multiplexer output signal of the section 21 is amplified by the amplifier 28 and converted by the ADC means 29 into the second code. Consequently, this code is applied to the encoder 27 via the multiplexer 26 and converted into the second binary code. The first binary code has a higher weight proportional to the gain of the amplifier 28. The binary codes are added/subtracted in the adder/accumulator 30 for providing the output code of the ADC. While the addition is executed, a new first code of the section 21 is applied to the encoder 27.

The entire process is controlled by a timing circuit which provides a clock signal to the multiplexer 26 operative to successively output the first and second codes applied thereto, and the adder/accumulator 30 for performing the addition. However, the timing circuit can also synchronize the remaining components due to their actual operating conditions. The FIG. 1 embodiment, theoretically, does not require any timing circuit as a distinct ADC output code is provided for any established input signal.

Similarly to the encoder 7 of FIG. 1, the encoder 27 is employed for sampling the "thermometer" or first and second codes, correcting faulty code sequences and obtaining the corresponding binary output codes. An encoder of an ordinary flash ADC can be employed. The encoder described in the patent application entitled "Encoder for Flash ADCs" having Ser. No. 946,598 and filed on 12/24/86 by the same inventor is recommended for a significantly higher performance.

Figure 4:
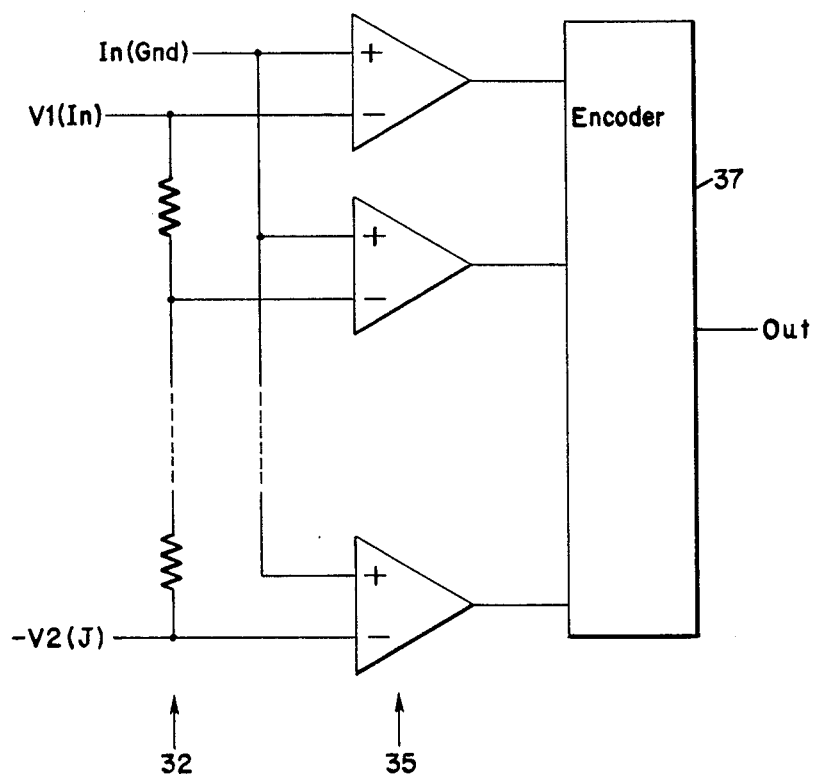
FIG. 4 shows the structure of an ordinary flash ADC.

FIG. 4 shows the structure of an ordinary flash ADC. The ADC can be employed as the ADC means 9 or 29 for obtaining the highest possible conversion rate. The ADC has an input which is coupled to the multiplexer output of the section 1 or 21, or the output of the optional amplifier 8 or 28. Either comparators 35 or resistor network 32 is coupled to the ADC input, whereby the network 32 provides reference or comparison voltages respectively.

Specifically, in one embodiment the flash ADC comprises a pair of reference voltage source V1 and $-V2$, the network 32 coupled thereto and a plurality of comparators 35. A current source can be substituted for V1 or $-V2$. Each comparator has an inverting input receiving a respective reference voltage deriving from the network 32, and a noninverting input coupled to the input of the ADC. Thereby, the ADC input voltage is compared against the reference voltages. The comparators 35 produce a "thermometer" code in response to the ADC input signal.

In another embodiment the network 32 is coupled between the ADC input and current source J, as indicated by names in parenthesis. Each of the comparators 35 has an inverting input receiving a respective comparison voltage deriving from the network 32, and a noninverting input coupled to ground. Thereby, the comparison signals are compared against ground. The comparators 35 produce a "thermometer" code in response to the ADC input signal. The polarity of the comparator inputs can be reversed for obtaining ascent output codes with increasing ADC input voltage.

The encoder 37 is coupled to the comparators 35 for converting the "thermometer" code into a corresponding binary code. The encoder 37 is superfluous if the ADC is used as the ADC means 29 in the embodiment of FIG. 3. However, the output codes of the section 21 and the ADC means 29 should be of the same type so that no additional switching within the encoder 27 is necessary. Therefore, the outputs of the comparators 35 can be coupled to AND gates, as described hereinabove, for converting the "thermometer" code into the second code. Otherwise, the section 21 can provide a respective "thermometer" code, whereby no additional gates are necessary.

Ideally, the signal appearing at the output of the amplifier 8 or 28 is zero or positive and smaller than the FSR, with reference to ground. This is determined by the respective comparators. However, the actual signal can be negative or exceed FSR due to inaccuracies of the resistor network, comparator offset voltages, nonlinearity of the amplifiers, etc. Therefore, by way of example, the resistor network 32 is coupled between the reference voltage source V1 having an increased value, and the negative source $-V2$. Furthermore, a higher number of resistors, comparators and switches, etc. is used. For instance, 300 rather than 255 comparators and a corresponding number of other components can be employed, whereby the encoder's 37 second code can represent a positive or negative number.

For instance, a 16-bit ADC may include 255 comparators in its comparator/multiplexer section and 300 in the ADC means, a single OA, multiplexer, encoder and adder/accumulator. However, even these small numbers can be further shrunk. For that purpose, the ADC means 9 or 29 can have the structure described hereinabove, such as of FIGS. 3 and 4. Still, only two OAs, single multiplexer, encoder and adder are necessary. The digital signal processing is analogous and will be apparent to those of ordinary skill in the art. Specifically, the multiplexer successively outputs three codes which are converted in the encoder in binary codes and then added in the adder for obtaining the ADC output code. For instance, a 16-bit ADC would require approximately 150 comparators and a corresponding number of other components. The conversion speed may be the highest due to the extremely low number of components. Not only monolithic but also a hybrid integration of the 16-bit ADC is possible.

It shall be explicitly pointed out that the present invention is not a dual flash converter. Any embodiment according to the present invention has a straightforward structure, no feedback manipulating the input signal exists, no digital-to-analog converter is used, no amplification of differential signals is performed, etc. A dual flash ADC is subject matter of separate application entitled "Dual Flash Analog-to-Digital Converter" by the same inventor and filed on even date herewith.

The embodiments of the present invention described herein are intended to be taken in an illustrative and not a limiting sense. Various modifications and changes may be made to these embodiments by persons skilled in the art without departing from the scope of the present invention as defined in the appended claims.

I claim:

1. Analog-to-digital converter (ADC) for converting signal of input source into output code, comprising:
   a reference current source;
   a resistive means coupled between the input source and reference current source for providing a plurality of comparison signals;
   amplifier means each coupled for amplifying a respective comparison signal and providing an output signal;
   comparator means coupled for comparing the amplifier means output signals against ground, and producing a first code in response thereto;
   a multiplexer means for selecting one of the amplifier means output signals in response to the first code;
   an ADC means for converting the signal selected by the multiplexer means into a second code; and
   a digital means for converting the first and second codes into the output code of the ADC.

2. ADC of claim 1, further including a second amplifier means coupled between the multiplexer means and ADC means for amplifying the signal selected by the multiplexer means.

3. ADC of claim 2, wherein the second amplifier means includes:
   an operational amplifier having a noninverting input receiving the signal selected by the multiplexer means, an inverting input and output; and
   a second resistive means for coupling the output of the operational amplifier to the inverting input thereof.

4. ADC of claim 3, wherein the amplifier means includes a second current source coupled to the inverting input of the operational amplifier for causing an output offset voltage thereof.

5. ADC of claim 1, wherein the ADC means includes:
   a pair of reference signal sources;
   a second resistive means coupled between the reference signal sources for providing a plurality of reference signals; and
   second comparator means for comparing the signal selected by the multiplexer means against the reference signals, and producing the second code in response thereto.

6. ADC of claim 1, wherein the ADC means includes:
   a second reference current source;
   a second resistive means coupled between the multiplexer means and second reference current source for providing a plurality of second comparison signals in response to the signal selected by the multiplexer means; and
   second comparator means for comparing the second comparison signals against ground, and producing the second code in response thereto.

7. ADC of claim 1, wherein the resistive means includes equally valued resistors coupled in series.

8. ADC of claim 1, wherein the digital means includes an encoder means for converting the first code into a binary code, and an adder means for adding the binary code and second code, and providing the output code of the ADC.

9. ADC of claim 8, wherein the ADC means includes a second encoder means for providing the second code.

10. ADC of claim 1, wherein the digital means includes:
    a second multiplexer means operative to successively output the first and second codes applied thereto;
    an encoder means coupled to the second multiplexer means for successively converting the first and second codes into a first and second binary codes respectively; and
    an adder means for adding the first and second binary codes and providing the output code of the ADC.

11. Analog-to-digital converter (ADC) for converting signal of input source into output code, comprising:
    a reference current source;
    a resistive means coupled between the input source and reference current source for providing a plurality of comparison signals;
    comparator means coupled for comparing the comparison signals against ground, and producing a first code in response thereto;
    a multiplexer means for selecting one of the comparison signals in response to the first code;
    an amplifier means for amplifying the comparison signal selected by the multiplexer means and providing an output signal;
    an ADC means for converting the amplifier means output signal into a second code; and
    a digital means for converting the first and second codes into the output code of the ADC.

12. ADC of claim 11, wherein the amplifier means includes:
    an operational amplifier having a noninverting input receiving the comparison signal selected by the multiplexer means, an inverting input and output; and
    a second resistive means for coupling the output of the operational amplifier to the inverting input thereof.

13. ADC of claim 12, wherein the amplifier means includes a second current source coupled to the inverting input of the operational amplifier for causing an output offset voltage thereof.

14. ADC of claim 11, wherein the ADC means includes:
- a pair of reference signal sources;
- a second resistive means coupled between the reference signal sources for providing a plurality of reference signals; and
- second comparator means for comparing the amplifier means output signal against the reference signals, and producing the second code in response thereto.

15. ADC of claim 11, wherein the ADC means includes:
- a second reference current source;
- a second resistive means coupled between the amplifier means and second reference current source for providing a plurality of second comparison signals in response to the amplifier means output signal; and
- second comparator means for comparing the second comparison signals against ground, and producing the second code in response thereto.

16. ADC of claim 11, wherein the resistive means includes equally valued resistors coupled in series.

17. ADC of claim 11, wherein the digital means includes an encoder means for converting the first code into a binary code, and an adder means for adding the binary code and second code, and providing the output code of the ADC.

18. ADC of claim 17, wherein the ADC means includes a second encoder means for providing the second code.

19. ADC of claim 11, wherein the digital means includes:
- a second multiplexer means operative to successively output the first and second codes applied thereto;
- an encoder means coupled to the second multiplexer means for successively converting the first and second codes into a first and second binary codes respectively; and
- an adder means for adding the first and second binary codes and providing the output code of the ADC.

* * * * *